(12) United States Patent
Tohara et al.

(10) Patent No.: US 11,221,370 B2
(45) Date of Patent: Jan. 11, 2022

(54) REMAINING BATTERY ENERGY ESTIMATION DEVICE, REMAINING BATTERY ENERGY ESTIMATION METHOD, AND STORAGE MEDIUM

(71) Applicants: Kabushiki Kaisha Toshiba, Minato-ku (JP); Toshiba Energy Systems & Solutions Corporation, Kawasaki (JP)

(72) Inventors: Masahiro Tohara, Fuchu (JP); Masako Kiuchi, Fuchu (JP); Shunsuke Kawachi, Tama (JP); Mami Mizutani, Hachioji (JP); Takenori Kobayashi, Meguro (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 111 days.

(21) Appl. No.: 16/720,303

(22) Filed: Dec. 19, 2019

(65) Prior Publication Data
US 2020/0124676 A1 Apr. 23, 2020

Related U.S. Application Data

(63) Continuation of application No. PCT/JP2017/023914, filed on Jun. 29, 2017.

(51) Int. Cl.
*G01R 31/388* (2019.01)
*G01R 31/374* (2019.01)
*H02J 7/00* (2006.01)

(52) U.S. Cl.
CPC ......... *G01R 31/388* (2019.01); *G01R 31/374* (2019.01); *H02J 7/0013* (2013.01); *H02J 7/0048* (2020.01)

(58) Field of Classification Search
CPC .. G01R 31/388; G01R 31/374; G01R 31/367; G01R 31/3842; G01R 31/3648; G01R 31/382; H02J 7/0048; H02J 7/0013
(Continued)

(56) References Cited

U.S. PATENT DOCUMENTS 6,300,763 B1   10/2001   Kwok
7,233,128 B2 *  6/2007   Brost .................... H02J 7/1461
                                                        320/132
(Continued)

FOREIGN PATENT DOCUMENTS

EP   1 081 499 A1   3/2001
EP   3 115797 A1    1/2017
(Continued)

OTHER PUBLICATIONS

Pop, V, et al., "State-of-the-art of battery state-of-charge determination", Measurement Science and Technology 16 (2005), pp. R93-R110.
(Continued)

*Primary Examiner* — M Baye Diao
(74) *Attorney, Agent, or Firm* — Oblon, McClelland, Maier & Neustadt, L.L.P.

(57) ABSTRACT

A remaining battery energy estimation device according to an embodiment includes a current corrector, an SOC calculator, a voltage estimator, an SOC correction amount determiner, and a current error estimator. The current corrector determines a corrected current value on the basis of a current value and a current correction amount of a storage battery. The SOC calculator calculates an estimated SOC value of the storage battery on the basis of the corrected current value and an SOC correction amount. The voltage estimator determines an estimated voltage value of the storage battery on the basis of a temperature value of the storage battery, the
(Continued)

corrected current value, and the estimated SOC value. The SOC correction amount determiner determines the SOC correction amount on the basis of a comparison between a voltage value of the storage battery and the estimated voltage value. The current error estimator determines the current correction amount on the basis of the SOC correction amount.

7 Claims, 6 Drawing Sheets

(58) Field of Classification Search
USPC .......................................................... 324/426
See application file for complete search history.

(56) References Cited

U.S. PATENT DOCUMENTS

| | | | | |
|---|---|---|---|---|
| 10,118,500 | B2 * | 11/2018 | Lee | ........................ H01M 10/44 |
| 10,345,386 | B2 * | 7/2019 | Omi | .................... G01R 31/3842 |
| 10,353,007 | B2 * | 7/2019 | Wada | .................... G01R 31/382 |
| 2009/0024338 | A1 | 1/2009 | Suzuki | |
| 2009/0025429 | A1 | 1/2009 | Armando et al. | |
| 2013/0297243 | A1 | 11/2013 | Baba et al. | |
| 2014/0236511 | A1 | 8/2014 | Kulkarni | |
| 2014/0368208 | A1 | 12/2014 | Yamada | |
| 2016/0054390 | A1 | 2/2016 | Lin et al. | |
| 2016/0349329 | A1 | 12/2016 | Wada et al. | |
| 2018/0017628 | A1 | 1/2018 | Takegami et al. | |

FOREIGN PATENT DOCUMENTS

| | | | | |
|---|---|---|---|---|
| JP | 2006025538 | A * | 1/2006 | ............. Y02E 60/10 |
| JP | 2011-203259 | A | 10/2011 | |
| JP | 2013-72677 | A | 4/2013 | |
| JP | 5393619 | B2 | 1/2014 | |
| JP | 5616464 | B2 | 10/2014 | |
| JP | 2016-224022 | A | 12/2016 | |
| JP | 6055960 | B1 | 12/2016 | |

OTHER PUBLICATIONS

Edamoto, Y, et al., "SOC Estimation of HEV/EV Batteries", Calsonic Kansei Technical Review, vol. 10, 2013, 11 pages, (with English Abstract & English Machine Translation).

* cited by examiner

REMAINING BATTERY ENERGY ESTIMATION DEVICE, REMAINING BATTERY ENERGY ESTIMATION METHOD, AND STORAGE MEDIUM

CROSS-REFERENCE TO RELATED APPLICATION

This application is based upon and claims the benefit of priority from PCT/JP 2017/023914, filed on Jun. 29, 2017; the entire contents of which are incorporated herein by reference.

FIELD

Embodiments of the present invention relate to a remaining battery energy estimation device, a remaining battery energy estimation method, and a storage medium.

BACKGROUND

The use of a storage battery system is spreading in applications for suppressing fluctuations in power generation that uses natural energy such as sunlight and wind power as an energy source for mobile vehicles such as electric vehicles or in applications such as suppressing fluctuations in power demand or peak shift. To properly operate a storage battery system, it is important to accurately determine a state of charge (SOC), which is an index of the remaining battery energy (or charge rate) of a unit to be monitored, in as close to real time and as accurately as possible.

Various methods for estimating the SOC of a storage battery are known (see "V Pop, H J Bergveld, P H L Notten, P P L Regtien, "State-of-the-art of battery state-of-charge determination," Meas. Sci. Technol. 16(2005) R93-R110"). Examples include an actual measurement method of actually causing discharge and integrating a current value of the storage battery until discharge is completed, an open circuit voltage (OCV) method of obtaining an SOC from an OCV during a current pause period on the basis of the relationship between the SOC and the OCV, a current integration method of integrating the current value to obtain an SOC change (ΔSOC) over a certain period of time, and a closed circuit voltage (CCV) method of estimating the SOC from information such as voltage, current, and temperature during charging/discharging using an equivalent circuit model of the storage battery.

Each of the above methods has its own shortcomings. The actual measurement method is difficult to use during operation and its practical value is low since actual measurement changes the SOC itself. The OCV method is difficult to apply to a system that does not have a pause period (or cannot guarantee the presence of a pause period). When the current integration method is executed for a long period of time, steady-state errors in current measurement values may be accumulated, resulting in a large estimation error. The CCV method is more practical relative to other methods, but as long as there is a characteristic difference between the equivalent circuit model of the storage battery and the actual storage battery, an SOC estimation error corresponding to the difference will occur. This error appears especially during a transient response when the current or SOC changes greatly.

The technique described in Patent Literature 1 (Japanese Patent No. 5393619) has a function of correcting a steady-state error in a current measurement value. However, the technique described in Patent Literature 1 has a problem that a residual error in a current offset that is uncorrectable cannot be corrected.

In the technique described in Patent Literature 2 (Japanese Patent No. 5616464), a steady-state error in a current measurement value is estimated on the basis of an error (a voltage difference) between an estimated voltage and an actual measured voltage and the estimated steady-state error is used for current correction. However, the technique described in Patent Literature 2 has a problem that a processing load is great because current correction is performed through a Kalman filter.

In the technique described in Patent Literature 3 (Japanese Unexamined Patent Application, First Publication No. 2016-224022), a steady-state error in a current measurement value and a full charge capacity error together are estimated through periodic processing. However, the technique described in Patent Literature 3 has a problem that a processing load is great.

In the technique described in Patent Literature 4 (Japanese Patent No. 6055960), an equivalent circuit parameter of a storage battery is estimated, but it has a problem that a processing load is great. In addition, since a steady-state error in the current measurement value is not estimated, an error in a transient response occurs in a situation such as that where the SOC changes greatly.

In the technique described in Non-Patent Literature 2 (CALSONIC KANSEI TECHNICAL REVIEW vol. 10 2013 "Battery charge rate estimation for HEV/EV"), the Kalman filter is configured such that the error between the estimated SOC value based on the OCV method and the estimated SOC value based on the current integration method is small. However, the error may increase depending on the current waveform.

DESCRIPTION OF EMBODIMENTS

It is an object of the present invention is to provide a remaining battery energy estimation device, a remaining battery energy estimation method, and a storage medium that can estimate the SOC of a storage battery with high accuracy while suppressing a processing load.

A remaining battery energy estimation device according to an embodiment includes a current corrector, an SOC calculator, a voltage estimator, an SOC correction amount determiner, and a current error estimator. The current corrector determines a corrected current value on the basis of a current value and a current correction amount of a storage battery. The SOC calculator calculates an estimated SOC value of the storage battery on the basis of the corrected current value and an SOC correction amount. The voltage estimator determines an estimated voltage value of the storage battery on the basis of a temperature value of the storage battery, the corrected current value, and the estimated SOC value. The SOC correction amount determiner determines the SOC correction amount on the basis of a comparison between a voltage value of the storage battery and the estimated voltage value. The current error estimator determines the current correction amount on the basis of the SOC correction amount.

Here, "to do~on the basis of" does not mean to perform processing directly on the basis of certain information alone and may mean to perform processing using other information in addition to certain information or to perform processing indirectly using certain information.

Hereinafter, a remaining battery energy estimation device, a remaining battery energy estimation method, and a program according to an embodiment will be described with reference to the drawings. The remaining battery energy estimation device is a device for estimating the SOC, which is the remaining amount (or charge rate) of a storage battery (secondary battery), with high accuracy while operating the storage battery. The storage battery to be estimated may be a battery cell as a minimum unit, a battery pack in which battery cells are combined in series, parallel, or series-parallel, or a battery pack unit in which battery packs are combined in series, parallel, or series-parallel. The following description will be given assuming that the storage battery to be estimated is a battery cell.

First Embodiment

[Configuration]

Figure 1:
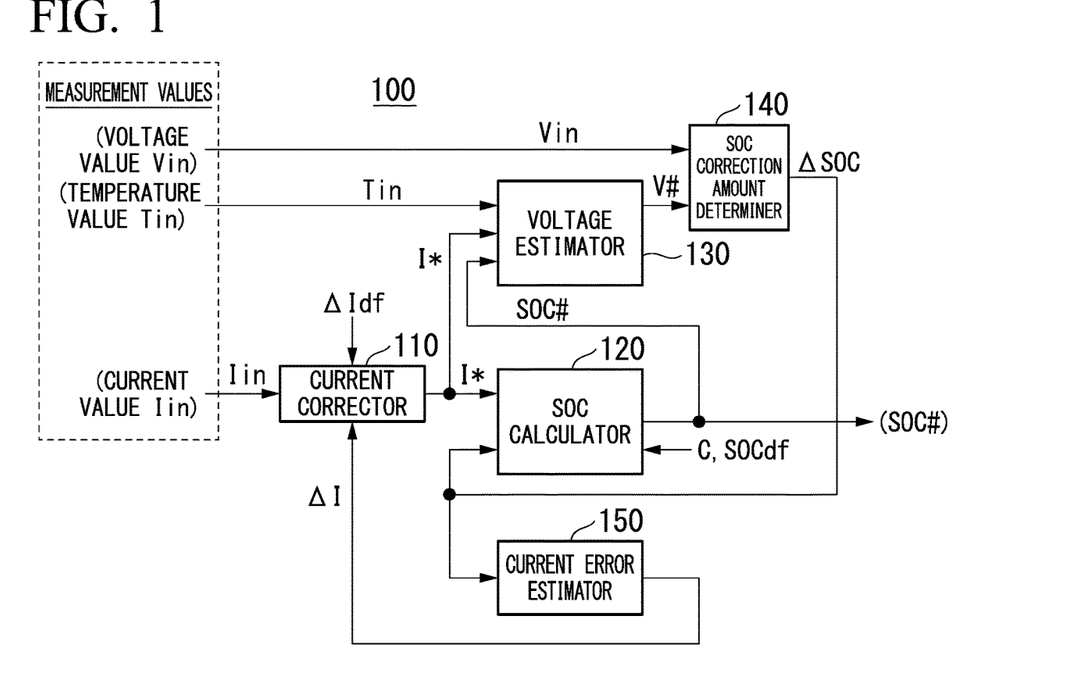
FIG. 1 is a functional configuration diagram of a remaining battery energy estimation device according to a first embodiment.

FIG. 1 is a functional configuration diagram of a remaining battery energy estimation device 100 according to a first embodiment. The remaining battery energy estimation device 100 includes, for example, a current corrector 110, an SOC calculator 120, a voltage estimator 130, an SOC correction amount determiner 140, and a current error estimator 150. These components are realized by a processor such as a central processing unit (CPU) executing a program (software). Some or all of these components may be realized by hardware (circuitry) such as a large scale integration (LSI), an application specific integrated circuit (ASIC), or a field-programmable gate array (FPGA) or may be realized by hardware and software in cooperation. Measurement values (detection values) such as a voltage value Vin, a temperature value Tin, and a current value Iin measured by sensors attached in the vicinity of a battery for remaining amount estimation are input to the remaining battery energy estimation device 100. Values such as a default correction amount $\Delta$Idf, a full charge capacity C, and a default SOC value SOCdf are given to the remaining battery energy estimation device 100. These values may be stored in a storage device such as a read only memory (ROM), a random access memory (RAM), a register, a flash memory, or a hard disk drive (HDD), or may be given from an external device (for example, an upper control device) as necessary. In FIG. 1, illustration of hardware such as input terminals through which measurement values are input is omitted.

The current corrector 110 determines a corrected current value I* on the basis of the current value Iin that is a measurement value and a current correction amount $\Delta$I. For example, the current corrector 110 determines the corrected current value I* by adding (or subtracting) the current correction amount $\Delta$I to (or from) the current value Iin. The current corrector 110 determines the corrected current value I* using the default correction amount $\Delta$Idf instead of the current correction amount $\Delta$I when the current correction amount $\Delta$I has not been obtained such as at the start of operation of the remaining battery energy estimation device 1. The corrected current value I* is output to the SOC calculator 120 and the voltage estimator 130. Here, "output" is a convenient expression and may refer to, for example, an operation of writing target data in a memory area that can be referred to by both an input operator and an output operator.

The SOC calculator 120 calculates SOC#, which is an estimated SOC value of the storage battery, on the basis of the corrected current value I* and the SOC correction amount $\Delta$SOC. For example, the SOC calculator 120 calculates the estimated SOC value SOC# on the basis of the full charge capacity Cmax and the default SOC value SOCdf of the storage battery in addition to the corrected current value I* and the SOC correction amount $\Delta$SOC.

Figure 2:
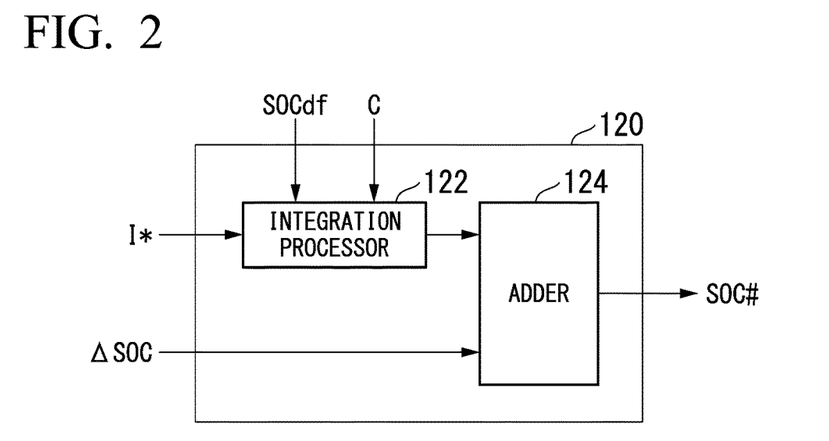
FIG. 2 is a diagram showing an example of a functional configuration of an SOC calculator.

FIG. 2 is a diagram illustrating an example of a functional configuration of the SOC calculator 120. The SOC calculator 120 includes, for example, an integration processor 122 and an adder 124. The integration processor 122 divides a value obtained by integrating the corrected current value I* by the full charge capacity C and then adds a previous estimated SOC value SOC# (initially, the default value SOCdf) to it and then outputs the resulting value to the adder 124. The adder 124 adds the value input from the integration processor 122 and the SOC correction amount $\Delta$SOC to calculate a present estimated SOC value SOC#. The default SOC value SOCdf is, for example, a value estimated by an OCV method. The default SOC value SOCdf is derived, for example, at the start of operation of a storage battery system (which will be described later) that is to be processed by the remaining battery energy estimation device 100. The full charge capacity C is set to an initial capacity at the time of shipment of the storage battery system from a factory and thereafter updated as needed on the basis of an actual measurement value in a periodic inspection, an estimated value during operation, or the like.

The content of processing performed by the SOC calculator 120 is expressed by Expression (1). In this expression, (n) indicates that the value is calculated in an nth cycle while the remaining battery energy estimation device 100 iteratively performs processing. SOC#(0)=SOCdf. Ts is the processing cycle of the iterative processing.

[Math. 1]

$$SOC\#(n+1) = SOC\#(n) + I*(n) \times \frac{Ts}{3600} \times \frac{1}{C} \times 100 + \Delta SOC(n) \quad (1)$$

The voltage estimator 130 outputs an estimated voltage value V# of the storage battery on the basis of the temperature value Tin, the corrected current value I*, and the estimated SOC value SOC#. The voltage estimator 130 derives the estimated voltage value V# of the storage battery by applying the above data to an equivalent circuit model of the storage battery. The voltage estimator 130 derives the estimated voltage value V# of the storage battery, for example, on the basis of the relationship between the voltage and the estimated SOC value SOC# that depends on the temperature value Tin and a voltage fluctuation amount based on an internal resistance and the corrected current value I*.

The SOC correction amount determiner 140 determines the SOC correction amount ΔSOC on the basis of a comparison between the voltage value Vin and the estimated voltage value V#. For example, the SOC correction amount determiner 140 derives the SOC correction amount ΔSOC by multiplying the difference between the voltage value Vin and the estimated voltage value V# by a gain Gk. The content of processing performed by the SOC correction amount determiner 140 is expressed by Expression (2). Vin−V# may be referred to as a voltage error ΔV.

$$\Delta SOC = Gk \times (Vin - V\#) \quad (2)$$

Figure 3:
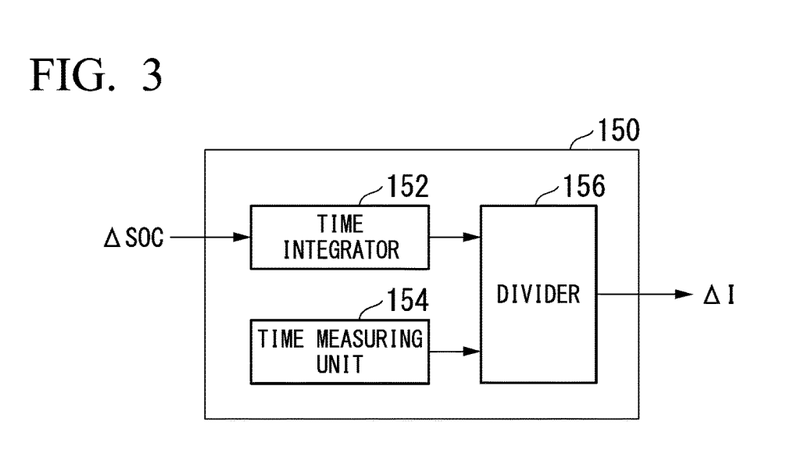
FIG. 3 is a diagram showing an example of a functional configuration of a current error estimator.

FIG. 3 is a diagram illustrating an example of a functional configuration of the current error estimator 150. The current error estimator 150 determines a current correction amount ΔI on the basis of the SOC correction amount ΔSOC. The current error estimator 150 includes, for example, a time integrator 152, a time measuring unit 154, and a divider 156. The time integrator 152 integrates a value indicated by the input SOC correction amount ΔSOC. The time measuring unit 154 measures the time during which the time integrator 152 performs integration. The divider 156 divides the integration result of the time integrator 152 by the time measured by the time measuring unit 154 to derive the current correction amount ΔI.

Here, the SOC calculator 120, the voltage estimator 130, and the SOC correction amount determiner 140 perform operations similar to a Kalman filter as a whole and correct the SOC such that the estimated voltage value V# output by the voltage estimator 130 matches the voltage value Vin. When the estimated voltage value V# substantially matches the voltage value Vin, the estimated SOC value SOC# output by the SOC calculator 120 is expected to match the actual SOC.

In the present embodiment, the gain Gk of the SOC correction amount determiner 140 is a small fixed value as will be described later. This is because a current offset error is basically assumed as an error factor of the estimated voltage value V#, and in the first embodiment, correction is performed such that the current offset error decreases. The current offset error is a steady-state error that occurs in the sensor that measures the current value Iin. Other error factors of the estimated voltage value V# include self-discharge of the storage battery and discharge by a cell balance circuit although the influence thereof upon SOC estimation is smaller than that of the current offset error.

To reduce the current offset error, in the first embodiment, the current error ΔI that the current error estimator 150 has estimated on the basis of the SOC correction amount ΔSOC is fed back and added to (or subtracted from) the current value Iin to derive the corrected current value I* and the SOC calculator 120, the voltage estimator 130, and the SOC correction amount determiner 140 perform the above operations using the corrected current value I*.

The SOC correction amount ΔSOC may not match the current offset error in a short term, but the SOC correction amount ΔSOC is expected to approach the current offset error stably by obtaining an average value for a long period (for example, a month). Expression (3) is an expression indicating that a current offset error Ioffset is asymptotically obtained on the basis of the integration of the SOC correction amount ΔSOC.

[Math. 2]

$$Ioffset = \frac{\sum \Delta SOC}{\sum t} \quad (3)$$

[About Gain Gk]

Hereinafter, a range in which the gain Gk [%/mV·s] can be taken will be described. A lower limit of the gain Gk is determined on the basis of a long-term error (residual error) and an upper limit thereof is determined on the basis of a short-term error. The current offset error Ioffset is a long-term error. Therefore, when paying attention to this, the gain Gk may be a value within a range determined with reference to the lower limit. For example, the gain Gk is preferably set to a value within a range from the lower limit to about 2 to 3 times the lower limit

[Long-Term Error and Lower Limit Value of Gain Gk]

Factors that determine the long-term error include a total current value Ie of error factors (including the current offset error Ioffset) [mA], a slope SL that is an OCV/SOC characteristic (the characteristic of a DOC change with respect to an OCV change) [mV/%], and the capacity Ch of the storage battery [Ah]. An SOC change amount per second based on these error factors is expressed by Expression (4).

$$(SOC\ change\ amount) = Ie/(1000 \times 3600 \times 100/Ch) \quad (4)$$

On the other hand, an SOC correction amount per second according to an embodiment is expressed by Expression (5).

$$(SOC\ correction\ amount) = Gk \times \Delta V \quad (5)$$
$$= Gk \times SL \times \Delta SOC$$

In the steady state, the SOC change amount and the SOC correction amount ΔSOC are balanced and therefore the gain Gk is expressed by Expression (6).

$$Gk = 2.8 \times 10^{-5} \times Ie/(Ch \times SL \times \Delta SOC) \quad (6)$$

The SOC correction amount ΔSOC in the steady state is also a steady-state error in the SOC. For this reason, when the upper limit of the SOC correction amount ΔSOC is ΔSOCmax, the lower limit value of the gain Gk is expressed by the right term of Expression (7).

$$Gk \geq 2.8 \times 10^{-5} \times Ie/(Ch \times SL \times \Delta SOC\ max) \quad (7)$$

[Short-Term Error and Upper Limit of Gain Gk]

Factors that determine a short-term error include a voltage error ΔV and a processing cycle Ts. The SOC correction amount ΔSOC is expressed by Expression (8).

$$\Delta SOC = Gk \times \Delta V \times Ts \quad (8)$$

When the upper limit of the allowable SOC correction amount ΔSOC is ΔSOCmax, the upper limit value of the gain Gk is expressed by the right term of Expression (9).

$$Gk \leq \Delta SOC\,\text{max}/(\Delta V \times Ts) \qquad (9)$$

The voltage error ΔV is a value that fluctuates depending on the system design. Therefore, although it cannot be generally stated, it is assumed in the above expression "the gain Gk is preferably set to a value within a range from the lower limit to about 2 to 3 times the lower limit" that it becomes close to or greater than a "value about 2 to 3 times the lower limit." Thus, by setting the gain Gk to a value no greater than about 2 to 3 times the lower limit, there is a high probability that the gain Gk can be prevented from exceeding the upper limit value of the gain Gk.

[Comparison]

Figure 4:
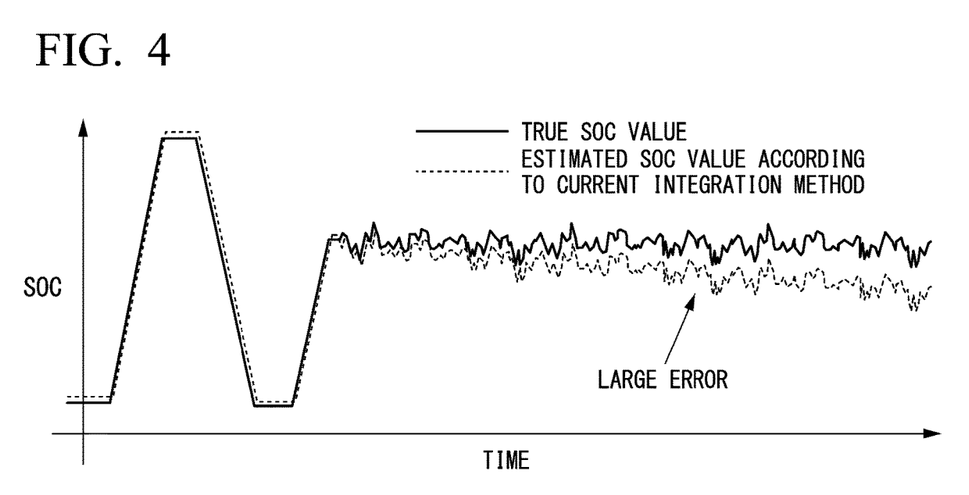
FIG. 4 is a diagram comparing actual SOC values (true SOC values) and estimated SOC values according to a current integration method when the current integration method is employed.

Here, comparisons with the methods in the related art will be described. FIG. 4 is a diagram comparing actual SOC values (true SOC values) and estimated SOC values according to the current integration method when the current integration method is employed. As described above, in the current integration method, steady-state errors in current measurement values may be accumulated, resulting in a large estimation error.

Figure 5:
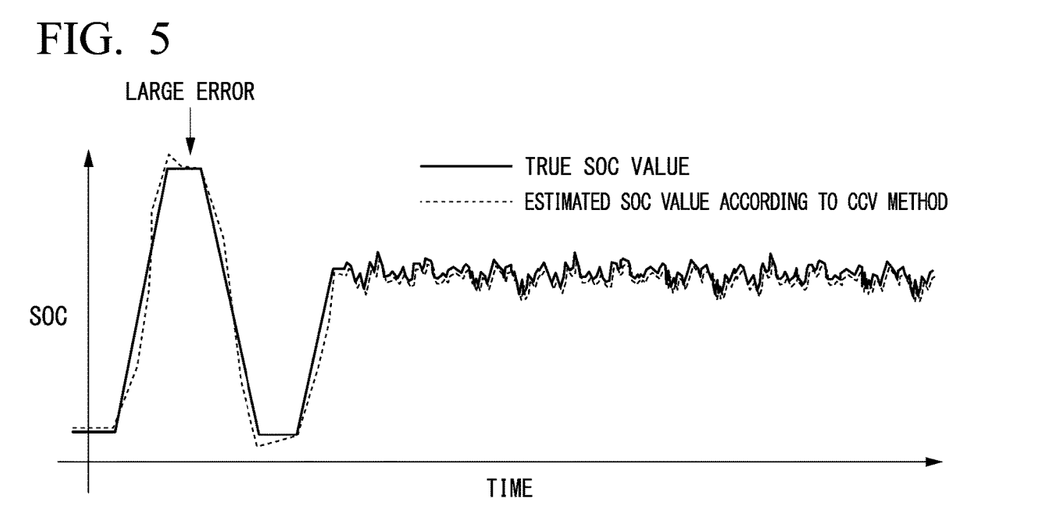
FIG. 5 is a diagram comparing actual SOC values (true SOC values) and estimated SOC values according to a CCV method when the CCV method is employed.

FIG. 5 is a diagram comparing actual SOC values (true SOC values) and estimated SOC values according to the CCV method when the CCV method is employed. As described above, in the CCV method, as long as there is a characteristic difference between the equivalent circuit model of the storage battery and the actual storage battery, an SOC estimation error corresponding to the difference occurs. This error appears especially during a transient response when the current or SOC changes greatly.

Figure 6:
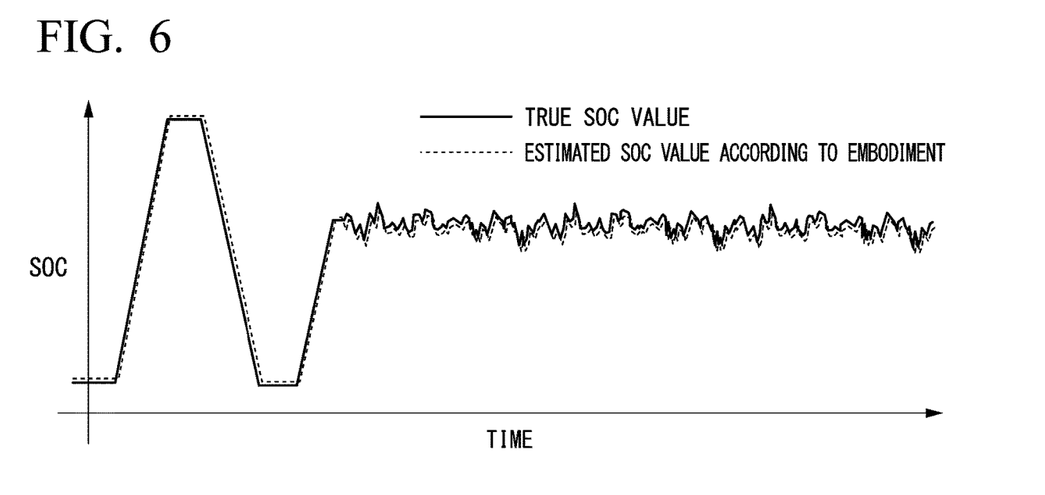
FIG. 6 is a diagram comparing actual SOC values (true SOC values) and estimated SOC values according to a method of the embodiment when the method of the embodiment is adopted.

On the other hand, FIG. 6 is a diagram comparing actual SOC values (true SOC values) and estimated SOC values according to the method of the embodiment when the method of the embodiment is adopted. As shown, the method of the embodiment exhibits characteristics that compensate for the shortcomings of the current integration method and the CCV method and thus can reduce both steady-state errors and errors during transient responses.

[Flowchart]

Figure 7:
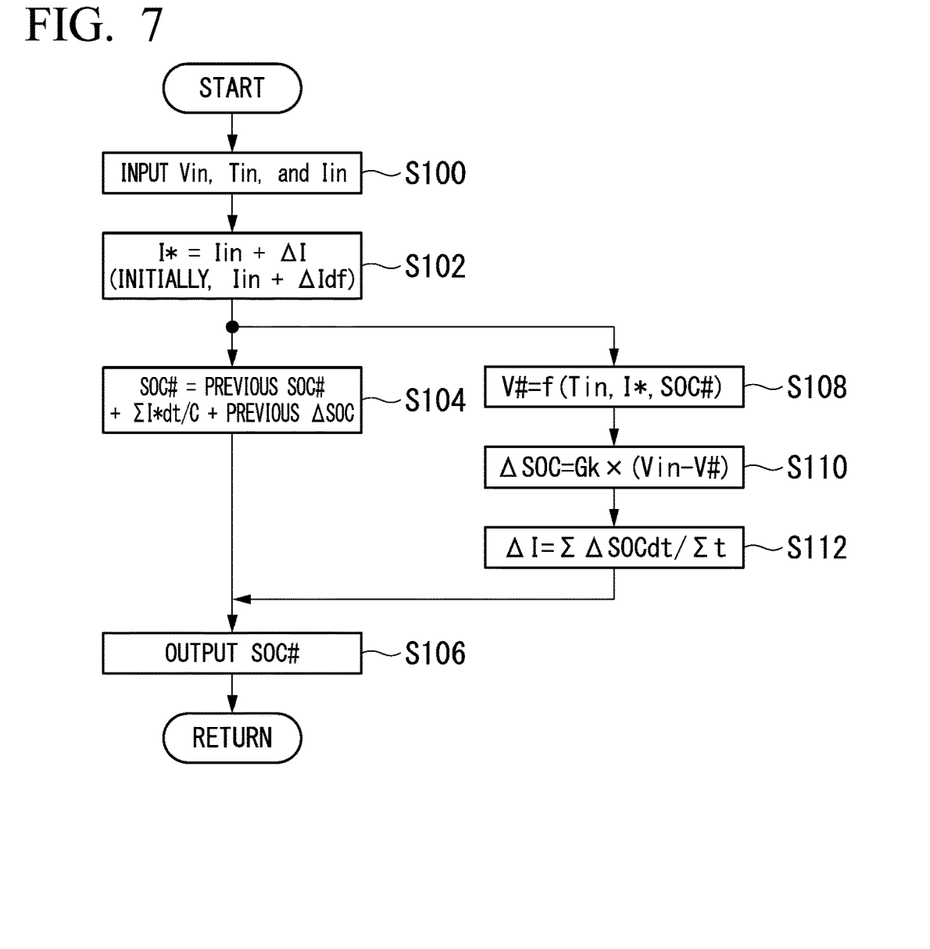
FIG. 7 is a flowchart showing an example of a flow of a process executed by the remaining battery energy estimation device.

FIG. 7 is a flowchart showing an example of a flow of a process executed by the remaining battery energy estimation device 100. For example, the process of this flowchart is executed iteratively at a predetermined cycle. Here, the content of the process is simply shown without considering the processing cycle Ts and the like.

First, measurement values such as a voltage value Vin, a temperature value Tin, and a current value Iin are input to the remaining battery energy estimation device 100 (step S100). Next, the current corrector 110 calculates a corrected current value I* on the basis of the current value Tin and a current correction amount ΔI (initially, ΔIdf) calculated in a previous routine of this flowchart (step S102).

Next, the SOC calculator 120 calculates a present estimated SOC value SOC# on the basis of an estimated SOC value SOC# calculated in the previous routine of this flowchart, the corrected current value I*, and an SOC correction amount ΔSOC calculated in the previous routine of this flowchart (step S104). The remaining battery energy estimation device 100 outputs the estimated SOC value SOC# calculated in step S104 (step S106).

On the other hand, the voltage estimator 130 applies the temperature value Tin, the corrected current value I*, and the estimated SOC value SOC# to the equivalent circuit model of the storage battery (represented as a function f in the drawing) to derive an estimated voltage value V# of the storage battery (step S108).

Next, the SOC correction amount determiner 140 calculates an SOC correction amount ΔSOC by multiplying the difference between the voltage value Vin and the estimated voltage value V# by the gain Gk (step S110), and the current error estimator 150 calculates a current correction amount ΔI by integrating the SOC correction amount ΔSOC (step S112). The SOC correction amount ΔSOC calculated in step S110 and the current correction amount ΔI calculated in step S112 are used in a next routine of this flowchart.

According to the first embodiment described above, by providing the current corrector 110 that determines a corrected current value on the basis of a current value and a current correction amount of a storage battery, the SOC calculator 120 that calculates an estimated SOC value of the storage battery on the basis of the corrected current value and an SOC correction amount, the voltage estimator 130 that outputs an estimated voltage value of the storage battery on the basis of a temperature value of the storage battery, the corrected current value, and the estimated SOC value, the SOC correction amount determiner 140 that determines the SOC correction amount on the basis of a comparison between a voltage value of the storage battery and the estimated voltage value, and the current error estimator 150 that determines the current correction amount on the basis of the SOC correction amount, it is possible to estimate the SOC of the storage battery with high accuracy while suppressing the processing load.

Modification of First Embodiment

Figure 8:
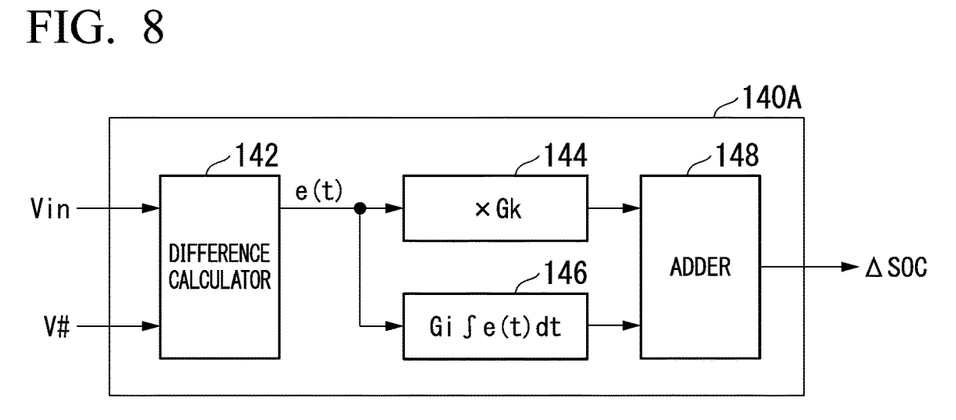
FIG. 8 is a diagram showing an example of a functional configuration of an SOC correction amount determiner.

In the first embodiment, the current corrector 110 and the current error estimator 150 may be omitted and the SOC correction amount determiner 140 may be replaced with an SOC correction amount determiner 140A described below. In this case, instead of the corrected current value I*, the current value Tin is input to an SOC calculator 120 and a voltage estimator 130. The SOC calculator 120 and the voltage estimator 130 perform the same processing as in the above embodiment with the corrected current value I* replaced with the current value Iin. FIG. 8 is a diagram illustrating an example of a functional configuration of the SOC correction amount determiner 140A. The SOC correction amount determiner 140A includes, for example, a difference calculator 142, a gain multiplier 144, an integration calculator 146, and an adder 148.

The difference calculator 142 calculates the difference between the voltage value Vin and the estimated voltage value V#. This difference is represented by e(t). The gain multiplier 144 multiplies the difference e(t) by the gain Gk and outputs the result. The integration calculator 146 outputs a time integral of the difference e(t) multiplied by a coefficient Gi. The adder 148 adds the output of the gain multiplier 144 and the output of the integration calculator 146 and outputs the result as an SOC correction amount ΔSOC.

In such a configuration, the same effects as those of the first embodiment can be obtained by appropriately determining the gain Gk and the coefficient Gi.

Second Embodiment

Figure 9:
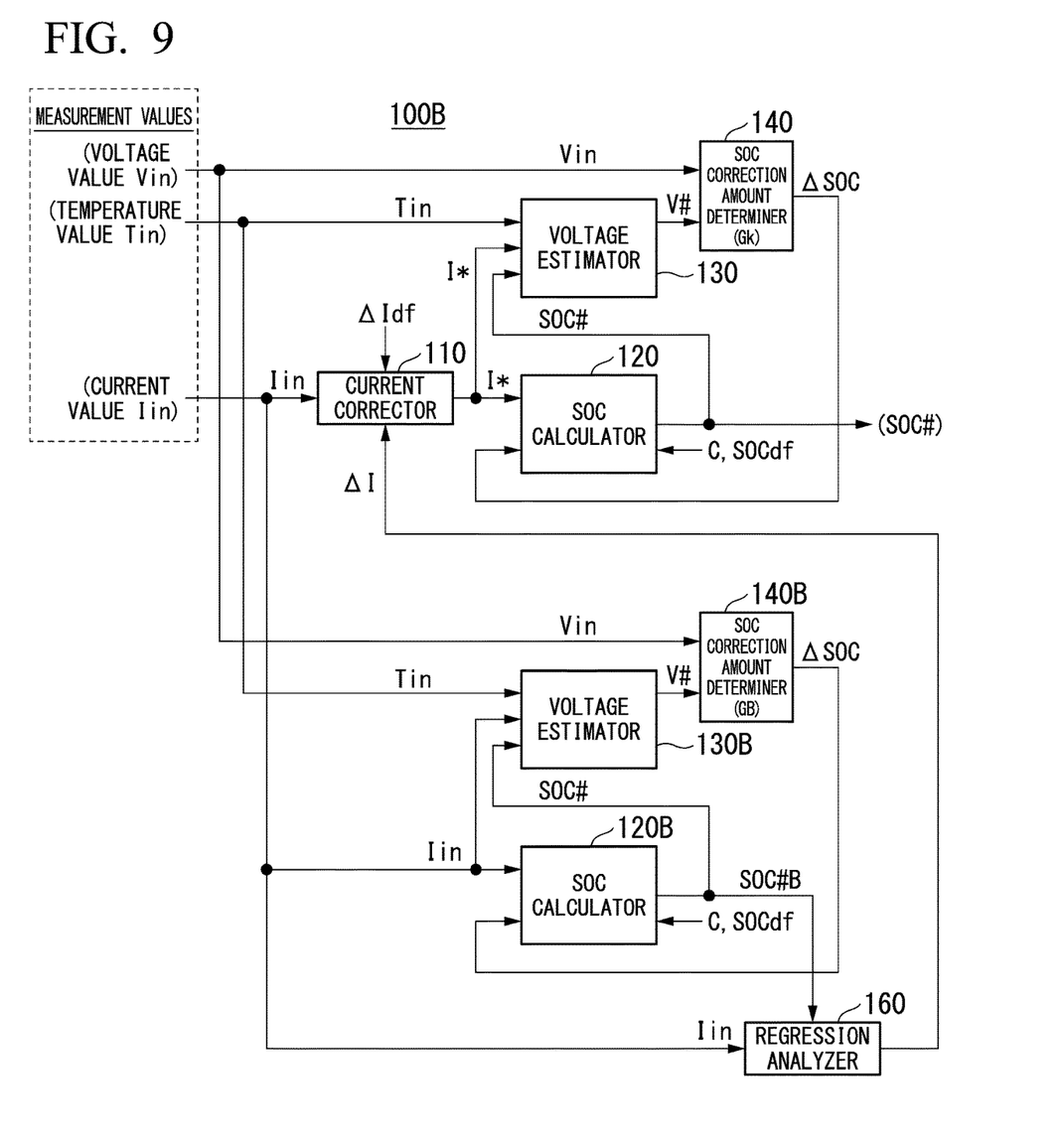
FIG. 9 is a functional configuration diagram of a remaining battery energy estimation device according to a second embodiment.

Hereinafter, a second embodiment will be described. FIG. 9 is a functional configuration diagram of a remaining battery energy estimation device 100B according to the second embodiment. The remaining battery energy estimation device 100B includes, for example, a current corrector 110, an SOC calculator 120, a voltage estimator 130, an SOC correction amount determiner 140, an SOC calculator 120B, a voltage estimator 130B, an SOC correction amount determiner 140B, and a regression analyzer 160. These components are realized by a processor such as a CPU executing a program (software). Some or all of these components may be realized by hardware (circuitry) such as an LSI, an ASIC, or an FPGA or may be realized by hardware and software in cooperation. Measurement values such as a voltage value Vin, a temperature value Tin, and a current value Iin measured by sensors attached in the vicinity of a battery for remaining amount estimation are input to the remaining battery energy estimation device 100B. Values such as a default correction amount ΔIdf, a full charge capacity C, and a default SOC value SOCdf are given to the remaining battery energy estimation device 100B. These values may be stored in a storage device such as a ROM, a RAM, a register, a flash memory, or an HDD, or may be given from an external device (for example, an upper control device) as necessary. In FIG. 9, illustration of hardware such as input terminals through which measurement values are input is omitted.

The functions of the current corrector 110, the SOC calculator 120, the voltage estimator 130, and the SOC correction amount determiner 140 are the same as those of the first embodiment. Hereinafter, the functions of the SOC calculator 120B, the voltage estimator 130B, the SOC correction amount determiner 140B, and the regression analyzer 160 will be described. The SOC calculator 120B, the voltage estimator 130B, and the SOC correction amount determiner 140B perform the same processing as the SOC calculator 120, the voltage estimator 130, and the SOC correction amount determiner 140 mainly with the corrected current value I* replaced with the current value Iin. However, a gain Ga of the SOC correction amount determiner 140B is greater than the gain Gk of the SOC correction amount determiner 140. For example, the gain Ga is greater the gain Gk by more than one order of magnitude.

The SOC calculator 120B calculates SOC#B, which is the estimated SOC value of the storage battery, on the basis of the current value Iin and the SOC correction amount ΔSOC. For example, the SOC calculator 120B calculates the estimated SOC value SOC#B on the basis of the full charge capacity C of the storage battery and the default SOC value SOCdf in addition to the current value Iin and the SOC correction amount ΔSOC. The functional configuration of the SOC calculator 120B is obtained, for example, by replacing the corrected current value I* in FIG. 2 with the current value Iin. The content of processing performed by the SOC calculator 120B is expressed by an expression obtained by replacing I*(n) with Iin(n) in Expression (1).

The voltage estimator 130B outputs an estimated voltage value V# of the storage battery on the basis of the temperature value Tin, the current value Iin, and the estimated SOC value SOC#B. The voltage estimator 130 derives the estimated voltage value V# of the storage battery by applying the above data to an equivalent circuit model of the storage battery. The voltage estimator 130 derives the estimated voltage value V# of the storage battery, for example, on the basis of the relationship between the voltage and the estimated SOC value SOC#B that depends on the temperature value Tin and a voltage fluctuation amount based on an internal resistance and the current value Iin*.

The SOC correction amount determiner 140B determines the SOC correction amount ΔSOC on the basis of a comparison between the voltage value Vin and the estimated voltage value V #. For example, the SOC correction amount determiner 140B derives the SOC correction amount ΔSOC by multiplying the difference between the voltage value Vin and the estimated voltage value V# by a gain Ga. The content of processing performed by the SOC correction amount determiner 140B is expressed by an expression obtained by replacing Gk with Ga in Expression (2).

Thus, the SOC calculator 120B, the voltage estimator 130B, and the SOC correction amount determiner 140B calculate the estimated SOC value SOC#B in the same manner as the SOC calculator 120, the voltage estimator 130, and the SOC correction amount determiner 140 with a different current value and gain as input values.

The regression analyzer 160 derives a current correction amount ΔI on the basis of the current value Iin and the estimated SOC value SOC#B. For example, the regression analyzer 160 divides an integral of a corrected current value I*B obtained by performing a predetermined offset correction on the current value Iin at a plurality of timings during an observation period by the capacity of the storage battery to calculate an SOC change amount and determines whether or not it matches the amount of change in the estimated SOC value SOC#B. The regression analyzer 160 performs this processing while gradually changing the amount of offset correction and determines the amount of offset correction at which it most closely matches the amount of change in the estimated SOC value SOC#B as a current correction value ΔI.

Figure 10:
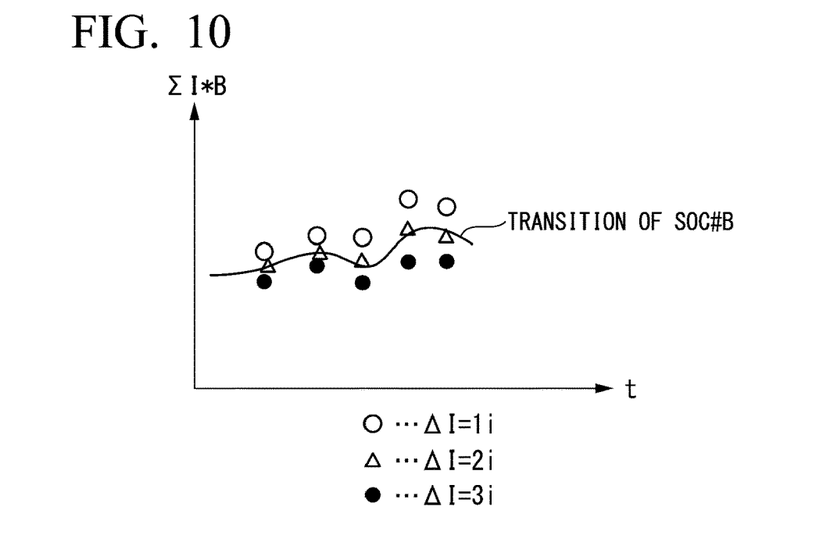
FIG. 10 is a diagram illustrating the content of processing performed by a regression analyzer.

FIG. 10 is a diagram illustrating the content of processing performed by the regression analyzer 160. As shown, the regression analyzer 160 obtains, for example, a plurality of patterns of the integral of the corrected current values I*B obtained by performing a predetermined offset correction on the current value Iin at a plurality of timings during an observation period. In the example of FIG. 10, the patterns of the integral ΣI*B of the corrected current value I*B are obtained respectively for ΔI=1i, 2i, and 3i. The regression analyzer 160 selects a pattern that most closely matches the amount of change in the estimated SOC value SOC#B among these patterns and sets a value corresponding to an offset correction which is the basis of the selected pattern as the current correction amount ΔI. The processing of the regression analyzer 160 may require manual operation. For example, the regression analyzer 160 may cause a display unit to display patterns of the integral ΣI*B as shown in FIG. 9 and set a value selected by an operator as the current correction amount ΔI. The regression analyzer 160 may also set a fixed value or pattern calculated by a machine or a person outside the operation of the system as a regression analysis result and may set a value corresponding to the set fixed value or pattern as the current correction amount ΔI.

Through such processing, it is possible to estimate the SOC of the storage battery with high accuracy while suppressing the processing load, similar to the first embodiment.

(Example Application)

Figure 11:
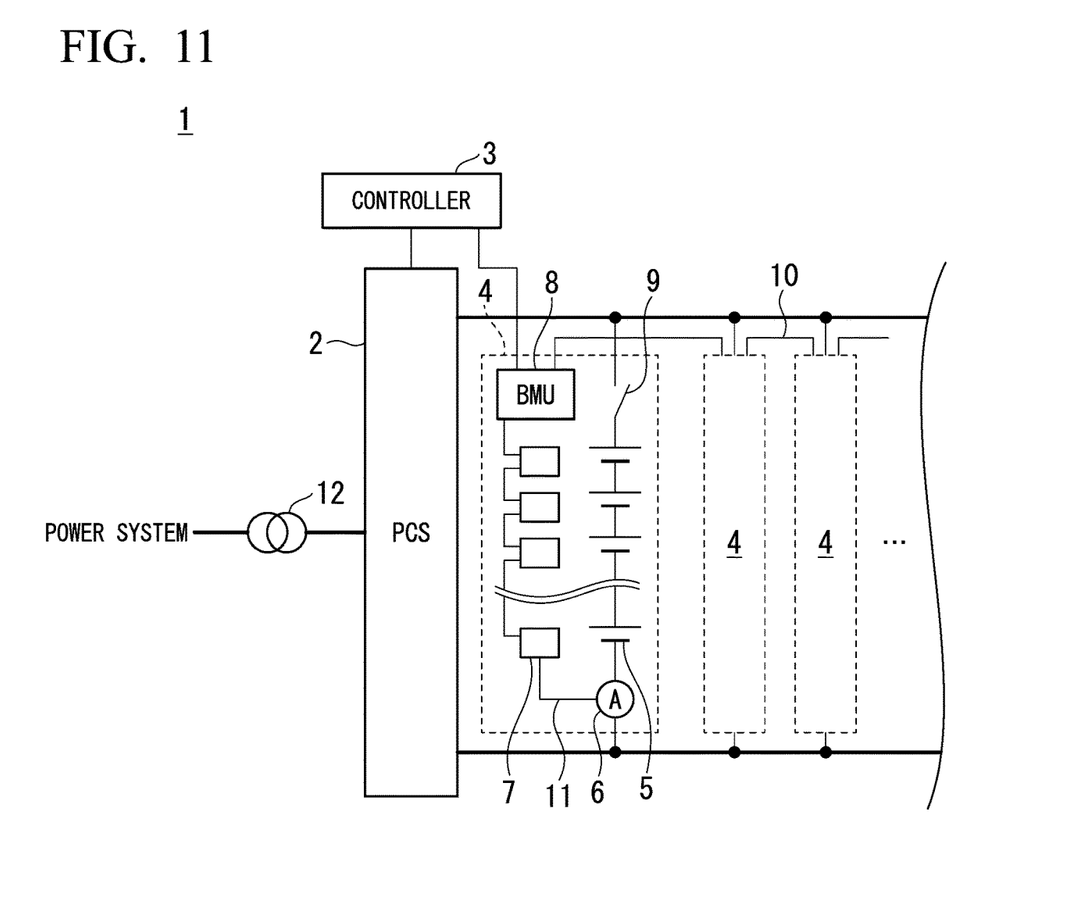
FIG. 11 is a configuration diagram of a power storage system which is an example of a system to which the remaining battery energy estimation device of each embodiment is applied.

FIG. 11 is a configuration diagram of a power storage system 1 which is an example of a system to which the remaining battery energy estimation device of each embodiment is applied. The power storage system 1 includes, for example, a power conditioning system (PCS) 2, a controller 3, and a plurality of battery panels (main circuits) 4. Each of the battery panels 4 includes, for example, a plurality of battery modules 5, an ammeter 6, a cell monitoring unit (CMU) 7, a battery management unit (BMU) 8, and a contactor 9.

The PCS 2 is connected to a power system, for example, via a transformer 12. The PCS 2 converts an alternating current from the power system into a direct current and supplies it to the battery panels 4 or converts a direct current from the battery panels 4 into an alternating current and supplies it to the power system.

The controller 3 controls each part in the PCS 2 and the battery panels 4. The controller 3 and the BMUs 8 of the battery panels 4 are communicably connected via a first communication line 10 that forms a daisy chain type network.

The plurality of battery panels 4 are connected in parallel to the PCS 2. Each battery module 5 of the battery panel 4 includes a rechargeable secondary battery such as a lithium ion battery, a lead storage battery, a sodium sulfur battery, a redox flow battery, or a nickel metal hydride battery. In the case of a lithium ion battery, the battery module 5 may be a battery using lithium titanate as a negative electrode material. For example, the plurality of battery modules 5 are connected in series in the battery panel 4.

The ammeter 6 detects (measures) a current in the battery panel 4 (a current flowing through each battery module 5) and outputs it to the CMU 7.

In addition to the current value from the ammeter 6, a voltage value and a temperature value of the battery module 5 detected (measured) by a voltmeter and thermometer (not shown) are input to the CMU 7. The CMU 7 transmits these pieces of information to the BMU 8 via a second communication line 11 that forms a daisy chain type network.

The BMU 8 calculates the SOC of each battery module 5 on the basis of the information received from the CMU 7. This function may also be included in the CMU 7. Further, the BMU 8 performs opening/closing control of the contactor 9, for example, in accordance with an instruction from the controller 3.

In such a configuration, the remaining battery energy estimation device can be applied to, for example, any one of the controller 3, the CMU 7, and the BMU 8. When it is applied to the CMU 7, the CMU 7 estimates the SOC of a corresponding battery module 5. When it is applied to the BMU 8, the SOC of each battery module 5 may be estimated or the SOC of a battery pack including battery modules 5 in a battery panel 4 may be estimated.

According to at least one embodiment described above, the current corrector 110 that determines a corrected current value on the basis of a current value and a current correction amount of a storage battery, the SOC calculator 120 that calculates an estimated SOC value of the storage battery on the basis of the corrected current value and an SOC correction amount, the voltage estimator 130 that outputs an estimated voltage value of the storage battery on the basis of a temperature value of the storage battery, the corrected current value, and the estimated SOC value, the SOC correction amount determiner 140 that determines the SOC correction amount on the basis of a comparison between a voltage value of the storage battery and the estimated voltage value, and the current error estimator 150 that determines the current correction amount on the basis of the SOC correction amount are provided, whereby it is possible to estimate the SOC of the storage battery with high accuracy while suppressing the processing load.

Although some embodiments of the present invention have been described, these embodiments have been presented by way of example and are not intended to limit the scope of the invention. These embodiments can be implemented in various other forms, and various omissions, substitutions, and changes can be made without departing from the spirit of the invention. These embodiments and modifications thereof are included in the scope or spirit of the invention as well as in the scope of the invention described in the claims and their equivalents.

What is claimed is:

1. A remaining battery energy estimation device comprising:
   a current corrector configured to determine a corrected current value on the basis of a current value and a current correction amount of a storage battery;
   a State of Charge (SOC) calculator configured to calculate an estimated SOC value of the storage battery on the basis of the corrected current value and an SOC correction amount;
   a voltage estimator configured to determine an estimated voltage value of the storage battery on the basis of a temperature value of the storage battery, the corrected current value, and the estimated SOC value;
   an SOC correction amount determiner configured to determine the SOC correction amount on the basis of a comparison between a voltage value of the storage battery and the estimated voltage value; and
   a current error estimator configured to determine the current correction amount on the basis of the SOC correction amount.

2. The remaining battery energy estimation device according to claim 1, wherein the SOC correction amount determiner is configured to determine the SOC correction amount by multiplying a difference between the voltage value of the storage battery and the estimated voltage value by a gain.

3. The remaining battery energy estimation device according to claim 2, wherein the gain is set to be equal to or higher than a lower limit value obtained by dividing a total current value of error factors by a product of a slope that is a characteristic of an SOC change with respect to an OCV change, a capacity of the storage battery, and an upper limit of the SOC correction amount.

4. A remaining battery energy estimation device comprising:
   a State of Charge (SOC) calculator configured to calculate an estimated SOC value of a storage battery on the basis of a current value and an SOC correction amount of the storage battery;
   a voltage estimator configured to determine an estimated voltage value of the storage battery on the basis of a temperature value of the storage battery, a current value of the storage battery, and the estimated SOC value; and
   an SOC correction amount determiner configured to calculate a difference between a voltage value of the storage battery and the estimated voltage value multiplied by a gain, calculate a time integral of the difference multiplied by a coefficient, and add the difference multiplied by the gain and the time integral multiplied by the coefficient to determine the SOC correction amount.

5. A remaining battery energy estimation device comprising:
   a current corrector configured to determine a corrected current value on the basis of a current value and a current correction amount of a storage battery;
   a first State of Charge (SOC) calculator configured to calculate an estimated SOC value of the storage battery on the basis of the corrected current value and an SOC correction amount;
   a first voltage estimator configured to determine an estimated voltage value of the storage battery on the basis of a temperature value of the storage battery, the corrected current value, and the estimated SOC value;

a first SOC correction amount determiner configured to determine the SOC correction amount on the basis of a comparison between a voltage value of the storage battery and the estimated voltage value;

a second SOC calculator configured to calculate an estimated SOC value of the storage battery on the basis of the current value of the storage battery and an SOC correction amount;

a second voltage estimator configured to determine an estimated voltage value of the storage battery on the basis of a temperature value of the storage battery, the current value of the storage battery, and the estimated SOC value;

a second SOC correction amount determiner configured to determine the SOC correction amount on the basis of a comparison between a voltage value of the storage battery and the estimated voltage value; and a regression analyzer configured to calculate a current integral while changing a correction amount with respect to the current value of the storage battery, search for a correction amount at which an amount of change in the estimated SOC value of the storage battery calculated by the second SOC calculator matches the current integral, and determine the current correction amount on the basis of a result of the search.

6. A remaining battery energy estimation method comprising:

a computer determining a corrected current value on the basis of a current value and a current correction amount of a storage battery;

calculating an estimated State of Charge (SOC) value of the storage battery on the basis of the corrected current value and an SOC correction amount;

determining an estimated voltage value of the storage battery on the basis of a temperature value of the storage battery, the corrected current value, and the estimated SOC value;

determining the SOC correction amount on the basis of a comparison between a voltage value of the storage battery and the estimated voltage value; and determining the current correction amount on the basis of the SOC correction amount.

7. A computer-readable non-transitory storage medium storing a program causing a computer to:

determine a corrected current value on the basis of a current value and a current correction amount of a storage battery;

calculate an estimated State of Charge (SOC) value of the storage battery on the basis of the corrected current value and an SOC correction amount;

determine an estimated voltage value of the storage battery on the basis of a temperature value of the storage battery, the corrected current value, and the estimated SOC value;

determine the SOC correction amount on the basis of a comparison between a voltage value of the storage battery and the estimated voltage value; and determine the current correction amount on the basis of the SOC correction amount.

\* \* \* \* \*